US006645679B1

(12) United States Patent
La Fontaine et al.

(10) Patent No.: US 6,645,679 B1
(45) Date of Patent: Nov. 11, 2003

(54) ATTENUATED PHASE SHIFT MASK FOR USE IN EUV LITHOGRAPHY AND A METHOD OF MAKING SUCH A MASK

(75) Inventors: Bruno M. La Fontaine, Pleasanton, CA (US); Calvin T. Gabriel, Cupertino, CA (US); Harry J. Levinson, Saratoga, CA (US); Kouros Ghandehari, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 81 days.

(21) Appl. No.: 09/803,853

(22) Filed: Mar. 12, 2001

(51) Int. Cl.$^7$ ................................................. G03F 9/00
(52) U.S. Cl. .......................................................... 430/5
(58) Field of Search ....................... 430/5, 322; 378/35, 378/34

(56) References Cited

U.S. PATENT DOCUMENTS

| | | | |
|---|---|---|---|
| 5,503,950 A | * 4/1996 | Miyake et al. | 430/5 |
| 5,928,813 A | 7/1999 | Krivokapic et al. | |
| 5,939,227 A | 8/1999 | Smith | |
| 6,013,399 A | * 1/2000 | Nguyen | 430/5 |
| 6,064,484 A | 5/2000 | Kobayashi et al. | |
| 6,187,484 B1 | 2/2001 | Glass et al. | 430/5 |
| 6,395,433 B1 | 5/2002 | Smith | 430/5 |
| 6,479,195 B1 | * 11/2002 | Kirchauer et al. | 430/5 |
| 2002/0122989 A1 | 9/2002 | Stearns et al. | 430/5 |

* cited by examiner

*Primary Examiner*—S. Rosasco
(74) *Attorney, Agent, or Firm*—Foley & Lardner

(57) ABSTRACT

An attenuated phase shift mask utilizes a multilayer which has been locally modified. Heat treatment or e-beam treatment can locally modify the multilayer to provide different reflective characteristics. The attenuated phase shift mask can be utilized in EUV applications.

20 Claims, 5 Drawing Sheets

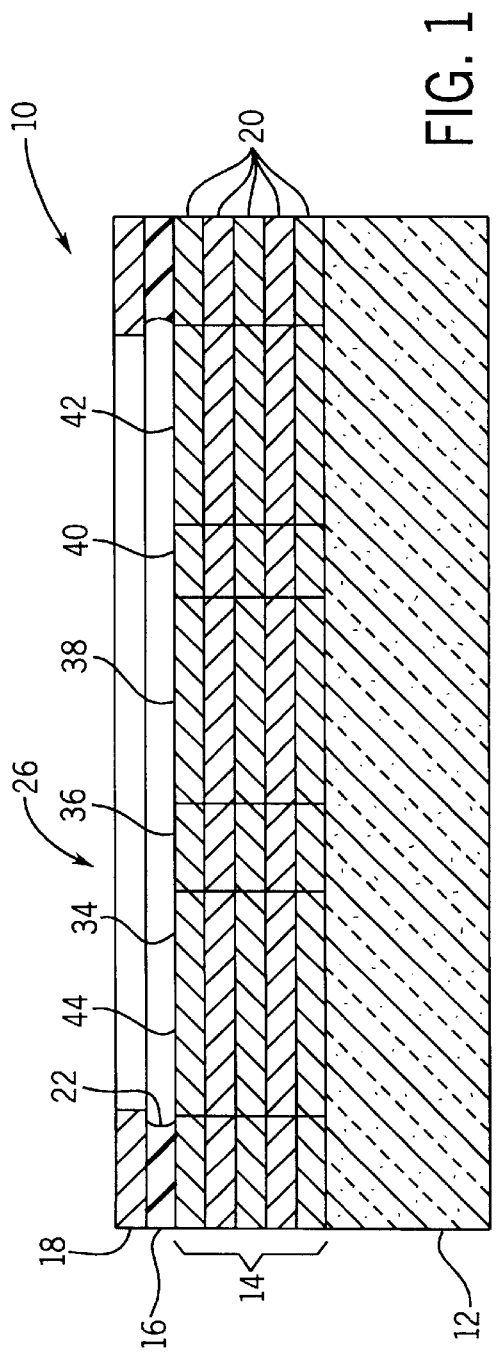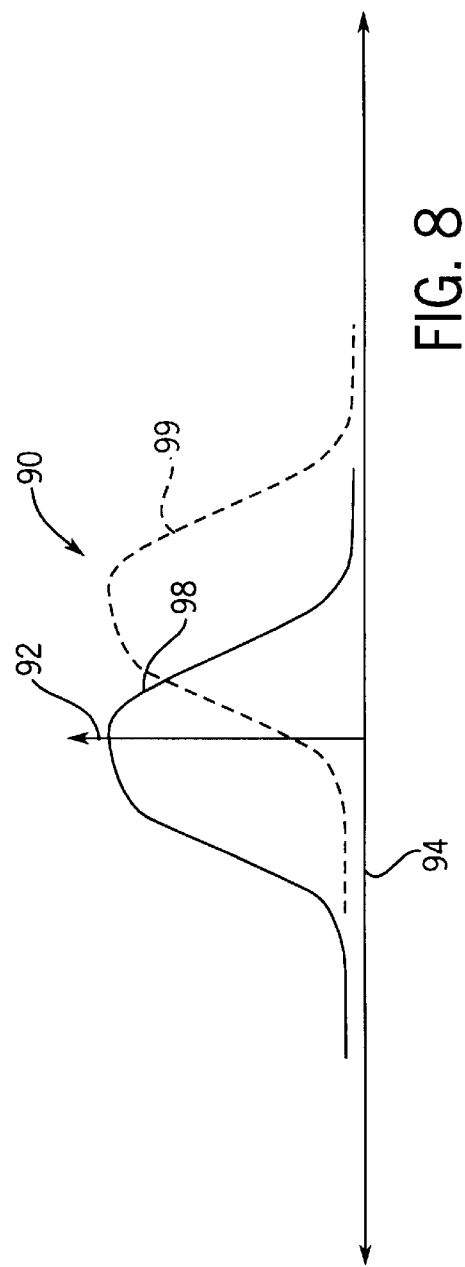

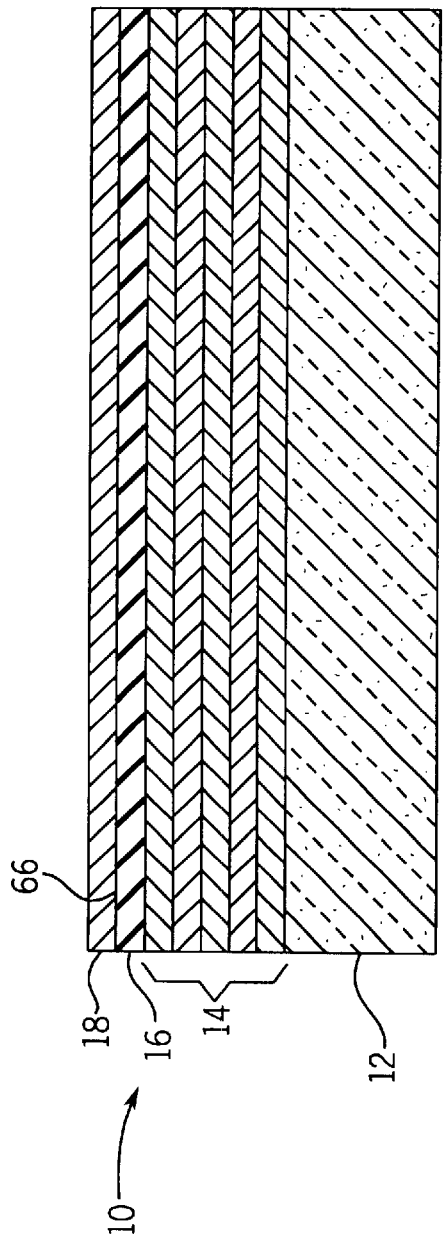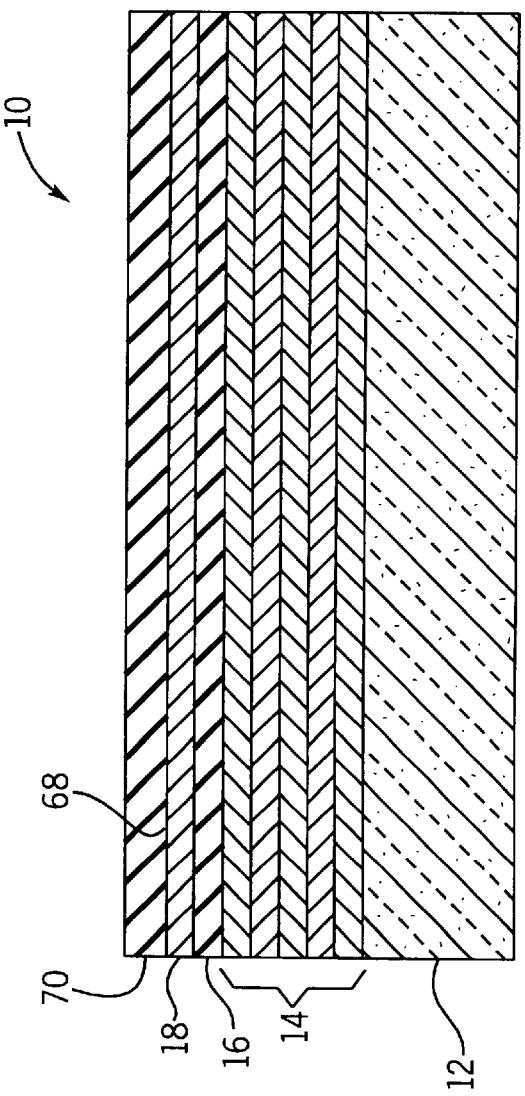

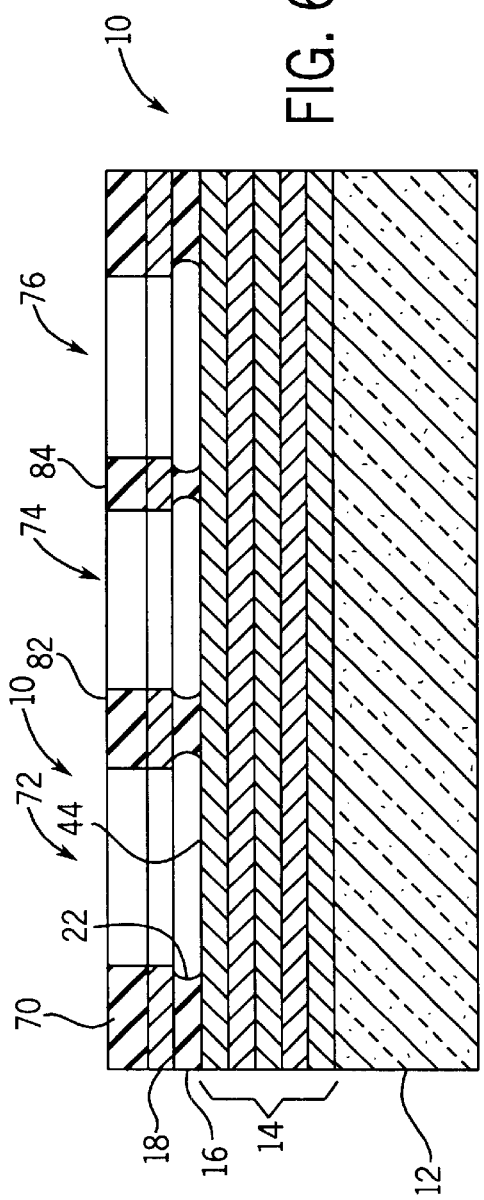
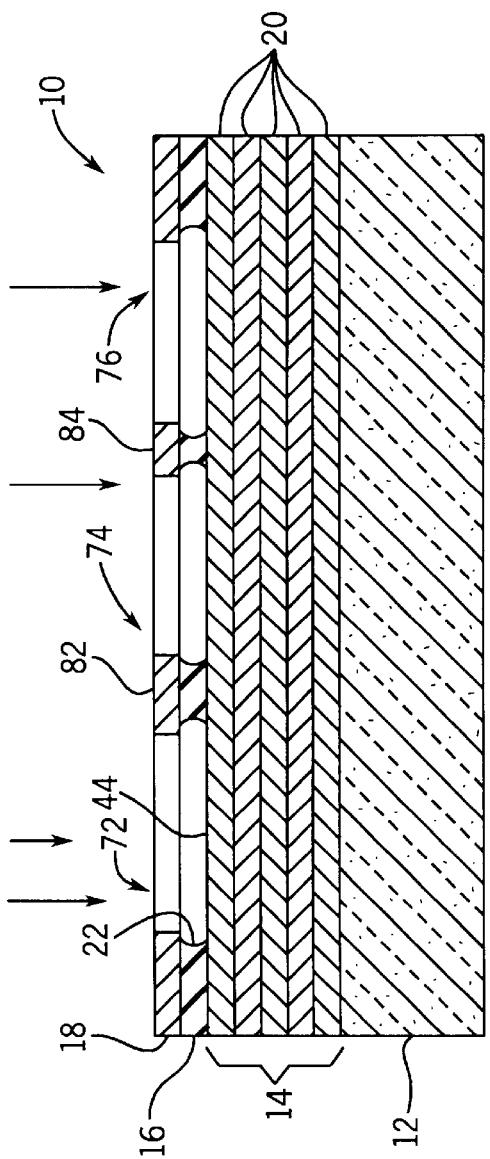

ATTENUATED PHASE SHIFT MASK FOR USE IN EUV LITHOGRAPHY AND A METHOD OF MAKING SUCH A MASK

FIELD OF THE INVENTION

The present invention relates generally to integrated circuit (IC) fabrication equipment. More particularly, the present invention relates to an attenuated phase shift mask and a method of manufacturing an attenuated phase shift mask.

BACKGROUND OF THE INVENTION

Semiconductor fabrication techniques often utilize a mask or reticle. Radiation is provided through or reflected off the mask or reticle to form an image on a semiconductor wafer. The wafer is positioned to receive the radiation transmitted through or reflected off the mask or reticle. The image on the wafer corresponds to the pattern on the mask or reticle. The radiation can be light, such as ultraviolet light, vacuum ultraviolet (VUV) light, extreme ultraviolet light (EUV) and deep ultraviolet light. The radiation can also be x-ray radiation, e-beam radiation, etc.

One advanced form of lithography is extreme ultraviolet (EUV) light lithography. A conventional EUV system (e.g., an optical reduction camera or stepper) utilizes an EUV radiation source, an EUV lens assembly (e.g., a condenser lens), an EUV reticle, and another EUV lens assembly (e.g., an objective lens). EUV radiation can be created at the radiation source and projected onto the reticle. The EUV reticle is typically a resonant-reflective medium including a pattern of absorbing material. The resonant-EUV reflects a substantial portion of the EUV radiation which carries an IC pattern formed on the reticle to the second EUV lens assembly. The lens assemblies can be an all resonant-reflective imaging system including aspheric optics at 4:1 magnification factor (e.g., a series of high precision mirrors). EUV radiation reflected off the EUV reticle is provided from the second EUV lens assembly to a photoresist coated wafer.

Generally, the reticle does not include a pellicle due to the lack of transparent material at EUV wavelengths. A demagnified image of the reticle pattern is projected onto portions of the resist-coated wafer. The entire reticle pattern is exposed onto the wafer by synchronously scanning the mask and the wafer (i.e., a step-and-scan exposure).

EUV lithography utilizes radiation in a wavelength of 5 to 70 nanometers (e.g., 11–14 nanometers). A conventional EUV lithographic system or EUV stepper provides the EUV reticle as a multilayer coated reflective mask or reticle which has an absorber pattern across its surface. The multilayer coated reflective reticle can utilize molybdenum/silicon (Mo—Si) layers or molybdenum/beryllium layers (Mo—Be).

Attenuated phase shift masks have been employed in less advanced lithography than EUV lithography. The attenuated phase shift masks provide resolution enhancement by reducing diffractive effects. Phase shift mask approaches have been discussed thoroughly in the literature. Phase shift mask technology is discussed in the following article: M. D. Levenson et al., "Improving Resolution in Photolithography with a Phase-Shifting Mask," IEEE Transactions on Electron Devices, Vol. ED-29, No. 12, pp. 1828–1836 (December 1982).

Attenuated phase shift masks (APSMs) have been disclosed that employ a thin layer which is partially light transmissive and effects a phase shift at the wavefront of the light. One such approach uses a thin layer of chromium (e.g., a few hundred angstroms, 100–300 Å), while a second such approach uses a chromium oxide. The locally modified portions also provide a phase shift to the reflected light at actinic wavelength, compared to the non-locally modified portion. In the first approach, a 30 nm thick layer of chromium and dry-etching into quartz (0.42 micrometers deep) is used to achieve 180 degree phase shift. In the second approach, a thicker layer of a chromium oxide, on the order of 200 nm, and an isotropic etch into the quartz substrate, (0.04 micrometers deep), is used to achieve 180 degree phase shifts. The foregoing values are based on using i-line wavelength (365 nm).

Although attenuated phase shift masks have been utilized in less advanced lithographic applications, an attenuated phase shift mask for EUV lithography has not been practicably achieved. As discussed above, attenuated phase shift masks can be created by placing a thin layer of material on the mask to provide subphase shift to the wavefront of the radiation. In EUV applications, the thin layer can be placed between an absorbent material and the substrate. However, this technique of using a thin layer between the absorbent material and the substrate is extremely difficult because the required thickness for the thin layer is so small in EUV applications. The thickness is related to the wavelength of light which is extremely small (often 5–14 nm) in EUV applications. Depositing the thin layer within such tight specification tolerances is not practicable. In addition, etching the thin layer is very difficult to control within the tight specification tolerances. Thus, a phase shift mask for EUV applications is not practicably available.

Thus, there is a need for an attenuated phase shift mask or reticle which can be utilized in EUV applications. Further, there is a need for an attenuated phase shift mask which can be easily manufactured. Further still, there is a need for an attenuated phase shift mask or reticle optimized for use in EUV applications or advanced lithography.

SUMMARY OF THE INVENTION

An embodiment relates to an attenuated phase shift mask for integrated circuit fabrication equipment. The attenuated phase shift mask includes a multilayer film relatively reflective to radiation having a wavelength of 70 nanometers or less. The multilayer film has locally modified portions. The locally modified portions are differently reflective at actinic wavelengths than non-locally modified portions.

Another embodiment relates to an attenuated phase shift mask for fabrication equipment. The mask includes means for reflecting radiation and means for attenuating and phase shifting the radiation. The means for attenuating and phase shifting and the means for reflecting are disposed on a same surface.

Yet another embodiment relates to a method of manufacturing a phase shift mask. The method includes providing a multilayer film on a substrate, providing a heat mask over the multilayer film, and selectively etching the heat mask to form a pattern. The method also includes heat treating the multilayer film in accordance with the heat mask.

Still another embodiment relates to a reticle or photomask for use with EUV radiation. The reticle or photomask provides locally attenuated phase shifting at actinic wavelengths in the EUV range.

BRIEF DESCRIPTION OF THE DRAWINGS

Exemplary embodiments will hereafter be described with reference to the accompanying drawings, wherein like numerals denote like elements, and:

FIG. 1 is a schematic cross-sectional view of an attenuated phase shift mask in accordance with an exemplary embodiment;

FIG. 4 is a schematic cross-sectional view of the attenuated phase shift mask illustrated in FIG. 3, showing a reflective layer deposition step;

FIG. 5 is a schematic cross-sectional view of the attenuated phase shift mask illustrated in FIG. 4, showing a photoresist deposition step;

FIG. 6 is a schematic cross-sectional view of the attenuated phase shift mask illustrated in FIG. 5, showing a selective etching step;

FIG. 7 is a schematic cross-sectional view of the attenuated phase shift mask illustrated in FIG. 6, showing a heat treatment step;

FIG. 8 is a graph representing attenuation characteristics of the attenuated phase shift mask illustrated in FIG. 1 in accordance with another exemplary embodiment;

DETAILED DESCRIPTION OF THE PREFERRED EMBODIMENTS

Figure 2:
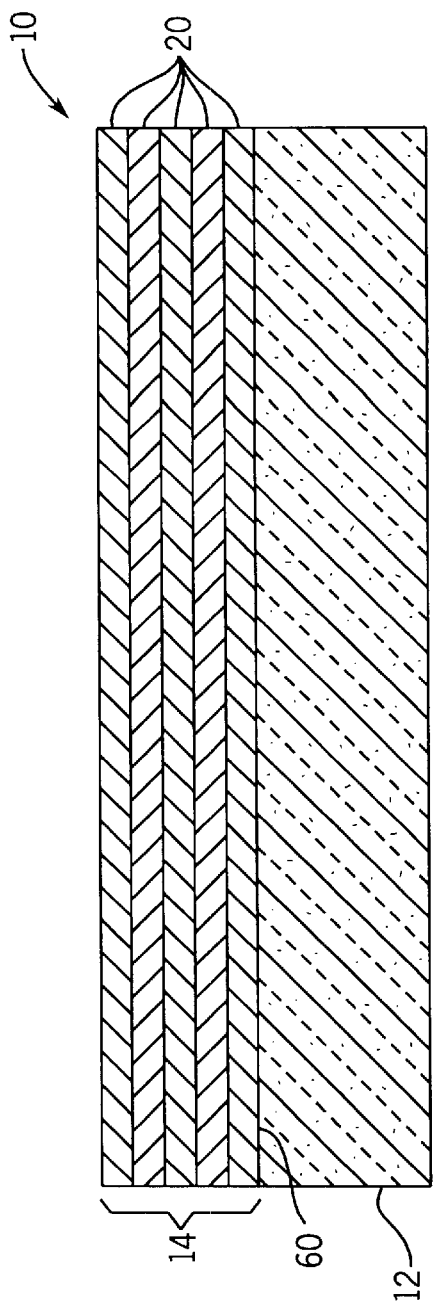
FIG. 2 is a schematic cross-sectional view of the attenuated phase shift mask illustrated in FIG. 1, showing a multilayer film formation step.

With reference to FIG. 1, a reticle or attenuated phase shift mask 10 is provided for use with semiconductor fabrication equipment. Mask 10 can be utilized in extreme ultraviolet (EUV) lithography wherein radiation having a wavelength of less than 70 nm is utilized (preferably between 5 and 14 nm). For example, radiation or ultraviolet light at a wavelength of 13.5 nm can be reflected off mask 10 to a semiconductor wafer coated with a photoresist. Alternatively, mask 10 can be employed at other locations with respect to the EUV or advanced lithographic system.

Attenuated phase shift mask 10 includes a substrate 12, a multilayer 14, a barrier layer 16, and a reflective layer 18. Substrate 12 can be a low thermal expansion material (LTEM), such as, ultra low expansion (ULE) glass manufactured by Corning. Alternatively, substrate 12 can be a silicon oxynitride (SiON) material. Layer 14 includes individual films or thin layers 20 of various materials.

Multilayer 14 is provided above substrate 12. Layers 20 of multilayer 14 can be molybdenum/beryllium (Mo—Be) film pairs (i.e., a layer of molybdenum above or below a layer of beryllium in each film pair). Each film pair is configured for maximum reflectance in the EUV band. Alternatively, layers 20 can be molybdenum/silicon (Mo—Si) film pairs configured for maximum reflectance in the EUV band. Each Mo—Si or Mo—Be film pair can be 5–7 nm thick. Multilayer 14 can include as many as forty pairs or more of layers 20 and have a total thickness of 300 nm.

Multilayer 14 is configured for reflectance at the actinic wavelength associated with the advanced lithographic or EUV lithographic system. The actinic wavelength is the wavelength which causes photochemical reactions to take place in the photoresist material on the wafer. Multilayer 14 can be manufactured by Osmic.

Alternative materials for multilayer 14 can also be used depending upon design parameters and system requirements. Any material highly reflective at EUV wavelengths (i.e., an EUV mirror) can be utilized for multilayer 14.

Barrier layer 16 is disposed above multilayer 14. Barrier layer 16 preferably has different etch characteristics than multilayer 14 (more particularly, different etch characteristics than the closest of layers 20 to layer 16). Layer 16 includes an undercut 22 associated with an etching of aperture 26 discussed below with reference to FIG. 6.

An absorptive reflective layer 18 is above layer 16 and preferably has different etch characteristics than layer 16. Layer 18 can have similar etch characteristics to those of multilayer 14 (e.g., those of the closest of layers 20 to layer 16). Alternatively, layer 18 can have different etch characteristics than those of the closest of layers 20 to layer 16. Layers 16 and 18 are preferably materials which can be easily deposited and etched in accordance with conventional fabrication techniques. Layer 16 can be a 70 nm thick film or layer of silicon dioxide ($SiO_2$) or silicon nitride ($Si_3N_4$). Layer 18 is preferably a reflective metal layer. Layer 18 can be a 30 nm–100 nm thick layer or film of chromium, chromium oxide, titanium nitride or tantalum nitride. Layer 18 can reflect or block radiation or particles with characteristics associated with a heating step described below with reference to FIG. 7. The radiation in the heating step can be at a wavelength of 800 nm (near infrared). Laser light should be chosen so it is absorbed by multilayer 14 and yet reflected by layer 18. Alternatively, the heat can be provided by a beam of electrons. However, layer 18 should be absorptive at the wavelengths associated with EUV lithography.

Mask 10 includes a portion 34, a portion 36, a portion 38, a portion 40 and a portion 42 within aperture 26. Portions 34, 36, 38, 40 and 42 are preferably provided within multilayer 14. Portions 36 and 40 have relatively good reflectance at actinic wavelengths (e.g., 11–14 nm). The term "relatively good reflectance" in this application refers to sufficient reflection of light for appropriate functioning of lithographic processes (e.g., sufficient reflectance at actinic wavelengths for EUV applications), which can be 60–70%. For example, portions 36 and 40 of multilayer 14 must reflect sufficient light relative to portions 34, 38 and 42 so that photoresist material can be patterned on a semiconductor wafer in accordance with the pattern of portions 34, 36, 38, 40 and 42. Regions 34, 38 and 42 preferably have relatively less reflectance (e.g., 5–10 percent) at actinic wavelengths. In addition, portions 34, 38 and 42 provide a phase shift of 180 degrees out of phase plus or minus 10 degrees at the actinic wavelength, and portions 36 and 40 provide a phase shift of 0 degrees plus or minus 10 degrees at the actinic wavelength.

Generally, portions 34, 38 and 42 of mask 10 have been locally controlled to change the reflectance and phase shift of surface 44 of multilayer 14. Preferably, portions 34, 38 and 42 are modified in a locally controlled thermal process. The modification makes portions 34, 38 and 42 less reflective at actinic wavelengths than portions 36 and 40.

The arrangement of portions 34, 38 and 42 and portions 36 and 40 provide a pattern for an image to be transferred to the wafer. Attenuated phase shift mask 10 can include a single large aperture 26 or many multiple apertures 26. The arrangement of portions 34, 36, 38, 40 and 42 and aperture 26 are not shown in FIG. 1 in a limiting fashion. Thus, mask 10 advantageously locally modifies the wave shaping or period associated with multilayer 14 so that portions 34, 38 and 42 reflect at a slightly different wavelength for a given wavelength (e.g., the reflection is decreased and a phase shift is introduced on the wavefront by a known amount).

Generally, during fabrication, portions 34, 38 and 42 are subjected to a temperature increase in the first few top layers of the multilayer 14 to produce the modification. The thermal process increases the local temperature in these first few layers thereby producing a depression of the top surface 44 and changing the reflective characteristics of portions 34, 38 and 42. Thus, mask 10 includes portions (portions 34, 38 and 42) which have been modified locally to adjust the phase shift and reflectance of multilayer 14 which covers substrate 12 to provide a pattern that can be projected within an EUV system.

With reference to FIGS. 1–5 an exemplary method for fabricating attenuated phase shift mask 10 is described below as follows. As discussed above, mask 10 is manufactured without relying upon conventional phase shifting layers.

In FIG. 2, mask 10 is provided as a mask blank and includes substrate 12 and multilayer 14. Substrate 12 can be an industry standard thickness. Substrate 12 and multilayer 14 can be a variety of shapes including squares, circles, ovals, rectangles, etc.

Layers 20 of multilayer 14 are preferably alternating layers of molybdenum and silicon, each 2–7 nm thick. Multilayer 14 is preferably formed on a top surface 60 of substrate 12. Multilayer 14 can include any number of layers 20 of various sizes depending upon the desired reflective properties for mask 10. As shown in FIG. 2, mask 10 does not yet include a pattern for reflecting an image to photoresist material on a semiconductor wafer.

Figure 3:
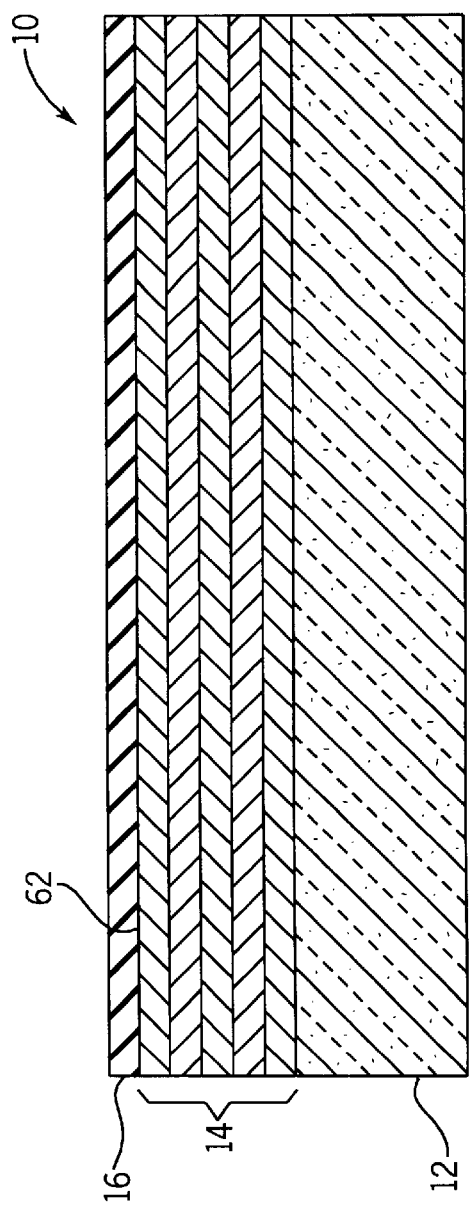
FIG. 3 is a schematic cross-sectional view of the attenuated phase shift mask illustrated in FIG. 2, showing a barrier layer deposition step.

In FIG. 3, film or repair buffer layer 16 is provided above a top surface 62 of multilayer 14. Layer 16 can be a 70 nm thick silicon oxide layer. Layer 16 can be deposited by a variety of processes including sputter deposition or chemical vapor deposition.

In FIG. 4, a film or reflective layer 18 is provided above a top surface 66 of layer 16. Layer 18 is preferably an absorbing layer with respect to the radiation provided in the lithographic system and a reflective or blocking layer with respect to the radiation used in the heat treatment step described below with reference to FIG. 7. Layer 18 can be a 30–100 nm thick layer of metal, such as, chromium. Layers 16 and 18 preferably have different etch characteristics. A variety of processes can be utilized to deposit layer 18 on surface 66 including sputter deposition.

With reference to FIG. 5, a photoresist layer 70 is provided above a top surface 68 of layer 18. Photoresist layer 70 can be a positive photoresist material having a thickness of 500 nm. Layer 70 is preferably spin-coated onto layer 18.

In FIG. 6, a conventional lithographic process can be utilized to provide apertures 72, 74 and 76 in photoresist layer 70. An exemplary lithographic process for forming apertures is a consists of exposure using an e-beam writer followed by development of the resist pattern.

Apertures 72, 74 and 76 in photoresist layer 70 are utilized to etch layer 18 and layer 16. Preferably, a chemical etch selective to layer 18 is utilized to extend aperture 72, 74 and 76 into layer 18 followed by a chemical etch selective to layer 16 to extend apertures 72, 74 and 76 through layer 16. Apertures 72, 74 and 76 expose top surface 44 of multilayer 14. Undercut 22 can be formed when layer 16 is etched.

Apertures 72, 74 and 76 form a pattern in layers 18 and 16 above multilayer 14. The pattern includes an island 82 between recesses 72 and 74 and an island 84 between recesses 74 and 76. Islands 82 and 84 can be a variety of dimensions depending upon the particular image to be transferred to the semiconductor wafer.

In FIG. 7, photoresist layer 70 can be stripped using a conventional photoresist removal process. Mask 10 is subjected to a thermal process after layer 70 is stripped. The thermal process causes the multilayer stack to collapse locally, thus producing a depression of the surface 44 and a change in the period of the multilayer. Alternatively, layer 70 can be stripped after mask 10 is subjected to thermal process described below.

Preferably, mask 10 is subjected to an electron beam process to heat multilayer 12 at surface 44. The electron beam can have an energy of 10 keV or other energy tuned to heat the top layers of the multilayer stack. The electron beam process can heat the top layers of the multilayer stack to approximately 500 degrees. Alternatively, other heating parameters can be utilized depending upon system requirements and design criteria. Also, other heating processes such as laser heating can be utilized to treat the multilayer stack.

The electron beam is blocked by layer 18 and absorbed on surface 44 through apertures 72, 74 and 76. Thus, the electron beam locally heats portions 34, 38 and 42 (FIG. 1). The local heating induces a change in the period of multilayer 14 and a depression of the top surface 44, thereby producing a change in reflectance of amplitude and a change in phase difference at the actinic wavelength. Thus, the heating step in FIG. 7 provides portions 36 and 40 having relatively higher reflectance at the actinic wavelength than portions 34, 38 and 42.

Layer 18 and layer 16 act as a heat mask for locally modified portions. The heat mask ensures that the heating of portions 34, 38, and 42 is confined.

As shown in FIG. 1, portion 36 corresponds to island 82, and portion 40 corresponds to island 84. Portions 34, 38 and 42 correspond to recesses 72, 74 and 76, respectively.

With reference to FIG. 1, islands 82 and 84 are removed in a selective etching process. The selective etching process can utilize another photoresist material.

According to one process, if layer 18 has different etch characteristics than the closest of layers 20 to layer 16, the photoresist material can cover layer 18 and be exclusive of recesses 72, 74 and 76 and islands 82 and 84. In this process, a two step etching process is utilized to remove layer 18 associated with islands 82 and 84 and layer 16 associated with islands 82 and 84.

With reference to FIG. 8, a graph 90 shows intensity of light on a Y-axis 92 with respect to wavelength on an X-axis 94. The intercept of the Y-axis 92 with the X-axis also indicates the actinic wavelength.

A solid line 98 indicates the intensity of light reflected off portions 36 and 40 (FIG. 1). As can be seen, a maximum amount of light is reflected off portions 36 and 40 at the actinic wavelength.

A dashed line 99 indicates a level of light reflected off portions 34, 38, and 42 (FIG. 1). In FIG. 8, the level of light reflected off portions 34, 38, and 42 at the actinic wavelength (line 99) is relatively small when compared to the level of light reflected off portions 36 and 40 (line 98).

Figure 9:
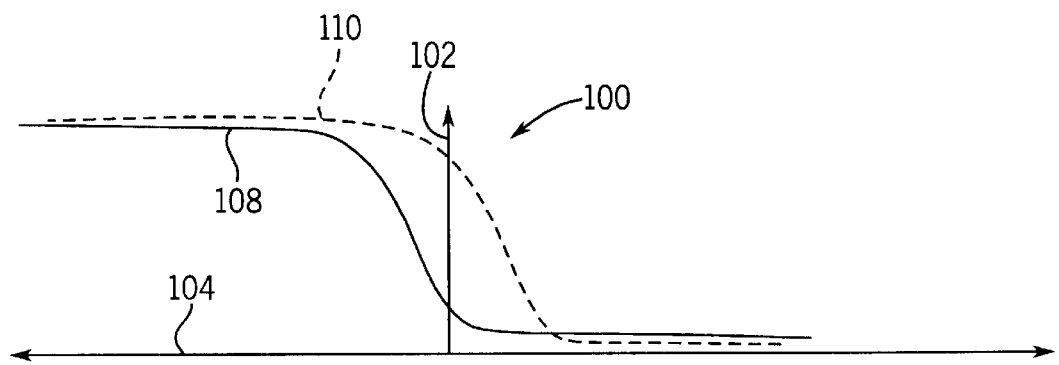
FIG. 9 is a graph representing phase shift characteristics of the attenuated phase shift mask illustrated in FIG. 1 in accordance with still another exemplary embodiment.

With reference to FIG. 9, a graph 100 shows a level of phase change on a y-axis 102 with respect to wavelength on an x-axis 104. The intercept of the Y-axis 102 with the X-axis also indicates an actinic wavelength.

A solid line 108 indicates the phase change associated with light reflected off portions 36 and 40 (FIG. 1).

A dashed line 110 indicates a phase change associated with light reflected off portions 34, 38 and 42 (FIG. 1). As can be seen, the phase change induced at the actinic wavelength by the reflection off portions 34, 38, andd 42 (dashed curve) can be significantly different from that induced by the reflection off portions 36 and 40 (solid curve).

Figure 10:
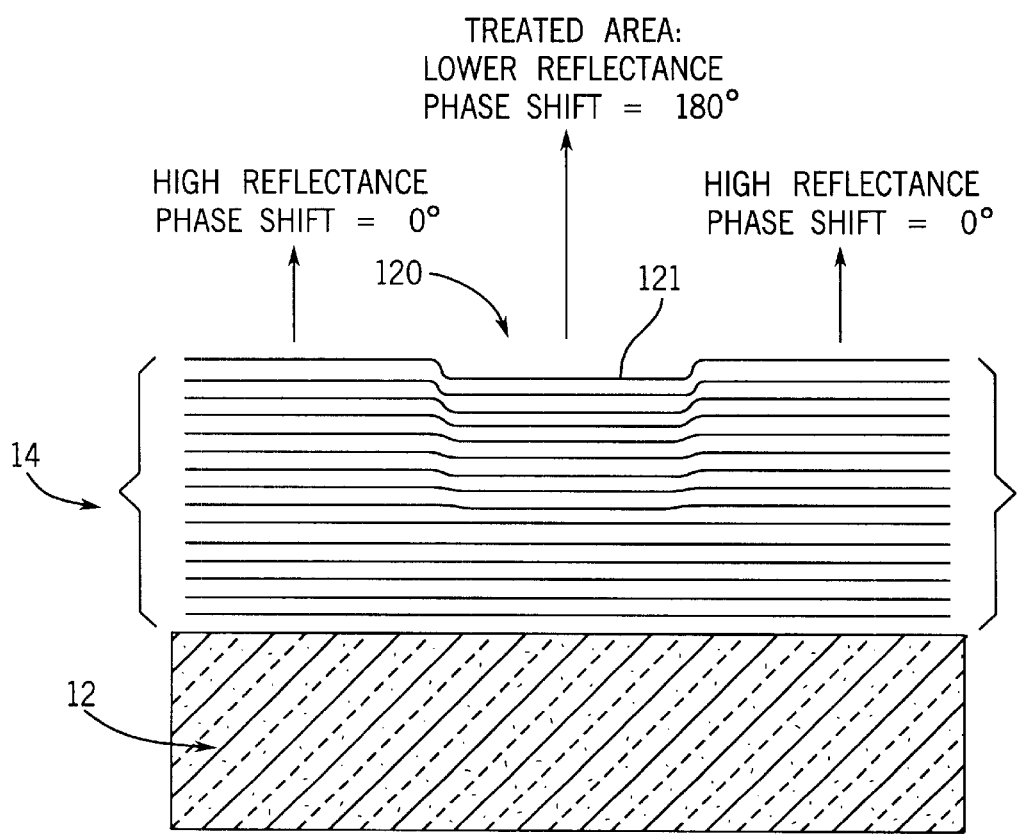
FIG. 10 is a schematic cross-sectional view of part of an attenuated phase-shift mask, showing a local depression of the top surface of the multilayer film that was heat treated, as well as the associated phase-shifted reflected light.

In FIG. 10, a cross section of mask 10 is schematically depicted to illustrate the collapse of multilayer film 14 in areas that received the heat treatment (such as portions 34, 38, and 42 in FIG. 1). This is represented in a central part 120 of the cross section, where a top surface 121 of the multilayer stack or film 14 is depressed. The combined effects of this depression of top surface 121 and of the local change in the period of the multilayer stack or film 14 produce a phase-shift of 180 degrees on the light reflected off the heat-treated area.

As demonstrated in FIGS. 8, 9, and 10, mask 10 is treated so that the period associated with portions 36 and 40 is changed with respect to portions 34, 38 and 42. The period change causes different phase change and reflectivity at the actinic wavelength. According to the exemplary characteristics shown in FIGS. 8 and 9, the reflectance and phase change is shifted in portions 34, 38 and 42 with respect to portions 36 and 42.

It is understood that although the detailed drawings, specific examples, and particular values given provide exemplary embodiments of the present invention, the exemplary embodiments are for the purpose of illustration only. The method and apparatus in the aforementioned embodiments are not limited to the precise details and descriptions disclosed. For example, although particular films, barrier layers, and substrates are described, other materials can be utilized. Various changes may be made to the details disclosed without departing from the spirit of the invention which is defined by the following claims.

What is claimed is:

1. A mask for integrated circuit fabrication equipment, the mask comprising;
   a multilayer film at least partially reflective to radiation having a wavelength of less than 70 nanometers, the multilayer film having locally modified portions, the locally modified portions being differently reflective at actinic wavelengths than non-locally modified portions;
   a buffer layer disposed above the multilayer film; and
   an absorbing layer disposed above the buffer layer, wherein the absorbing layer and the buffer layer include an aperture exposing at least one of the locally modified portions.

2. The mask of claim 1, further comprising a low thermal expansion substrate.

3. The mask of claim 2, wherein the locally modified positions are formed by a heat treatment step.

4. The mask of claim 3, wherein the heat treatment step utilizes beam of electron.

5. The mask of claim 2, wherein the substrate includes a first surface coupled to the multilayer film, and the multilayer film has a second surface, the second surface being positioned to receive EUV radiation.

6. The mask of claim 1 wherein the buffer layer includes cut-away portions on sidewalls of the aperture.

7. The mask of claim 6 wherein:
   the absorbing layer includes chromium.

8. The mask of claim 7, wherein the buffer layer is silicon dioxide or silicon nitride.

9. The mask of claim 8, wherein the absorbing layer is metal.

10. The mask of claim 7, wherein the absorbing layer is reflective to energy used in a heat treatment process for the locally modified portions and is absorbing to energy in the EUV range.

11. An attenuated phase shift mask for fabrication equipment, the mask comprising:
    means for reflecting radiation;
    means for attenuating and phase shifting the radiation, wherein the means for reflecting and means for attenuating and phase shifting are on a same surface and are the same material, wherein at least one of the means for attenuating and phase shifting and the means for reflecting radiation is a depression on the same surface; and
    a heat mask over the multilayer film, the heat mask including a buffer layer and a metal layer.

12. The attenuated phase shift mask of claim 11, wherein the same surface is a top surface of a multilayer film.

13. The attenuated phase shift mask of claim 11, wherein the radiation is EUV radiation.

14. The attenuated phase shift mask of claim 11, wherein the means for attenuating and phase shifting is a heat treated portion of the same surface.

15. The attenuated phase shift mask of claim 14, wherein the means for attenuating and phase shifting is treated with an electron beam.

16. A method of manufacturing a mask, the method comprising:
    providing a multilayer film on a substrate;
    providing a heat mask over the multilayer film, the heat mask including a buffer layer and a metal layer;
    etching the heat mask selectively to form a pattern; and
    heat treating the multilayer film in accordance with the pattern.

17. The method of claim 16, further comprising: removing islands of the heat mask from an aperture associated with the pattern.

18. The method of claim 16, wherein the multilayer film includes silicon or molybdenum.

19. The method of claim 16, wherein buffer layer includes silicon dioxide.

20. The method of claim 19, wherein the heat mask includes chromium.

* * * * *

UNITED STATES PATENT AND TRADEMARK OFFICE
CERTIFICATE OF CORRECTION

PATENT NO. : 6,645,679 B1
DATED : November 11, 2003
INVENTOR(S) : Berno M. La Fontaine et al.

It is certified that error appears in the above-identified patent and that said Letters Patent is hereby corrected as shown below:

Column 7,
Line 2, please replace "positions" with -- portions --.

Signed and Sealed this

Twenty-ninth Day of June, 2004

JON W. DUDAS
*Acting Director of the United States Patent and Trademark Office*